Figure 1:
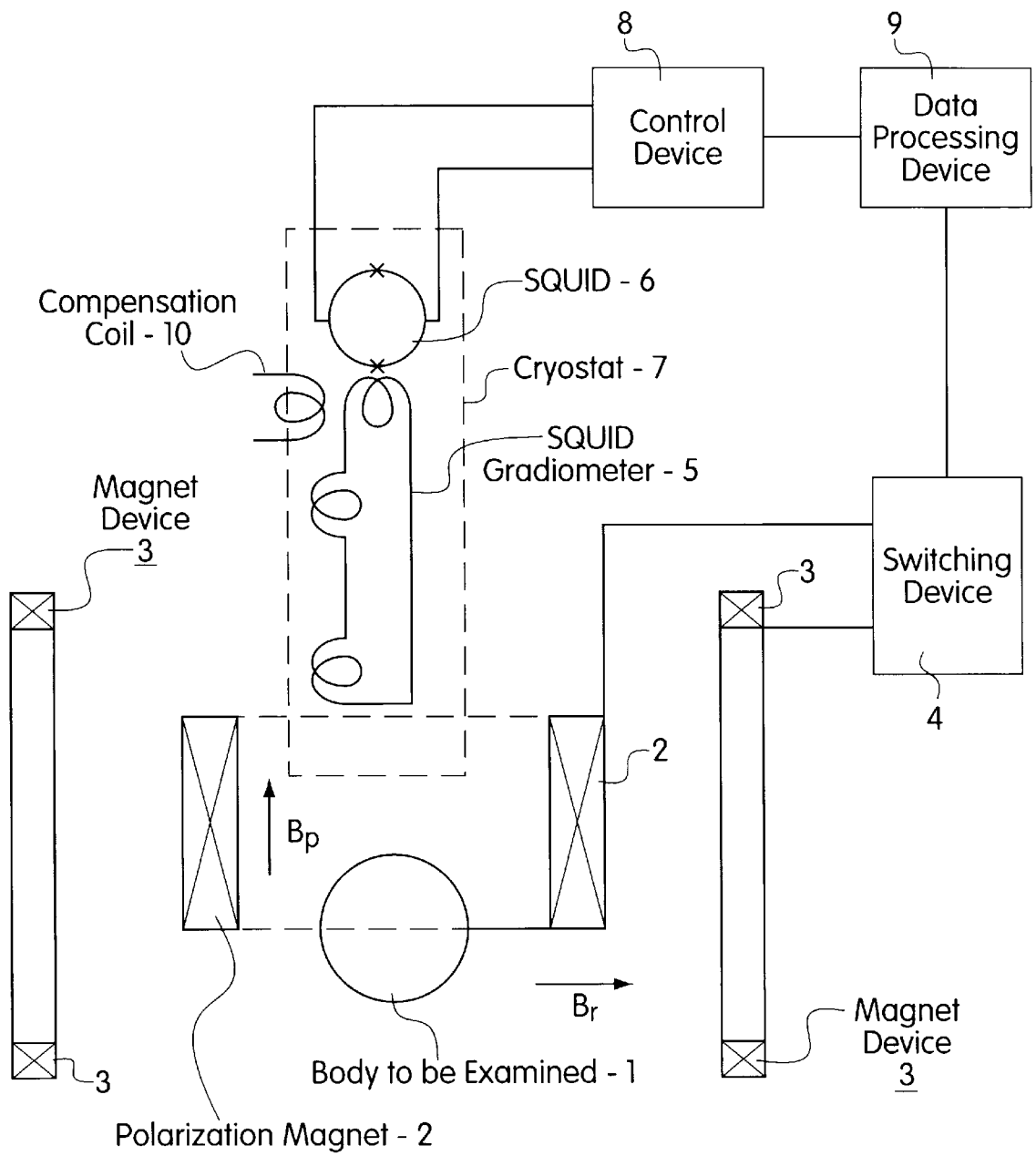

United States Patent

Szeles et al.

Patent Number: 6,031,373
Date of Patent: Feb. 29, 2000

[54] NUCLEAR MAGNETIC RESONANCE IMAGING PROCESS AND DEVICE

[75] Inventors: Josef Constantin Szeles, Glanzinggasse 5/7, A-1190 Wien, Austria; Sándor Mészáros, Debrecen, Hungary

[73] Assignee: Josef Constantin Szeles

[21] Appl. No.: 09/029,338

[22] PCT Filed: Aug. 27, 1996

[86] PCT No.: PCT/AT96/00155

§ 371 Date: Apr. 24, 1998

§ 102(e) Date: Apr. 24, 1998

[87] PCT Pub. No.: WO97/08564

PCT Pub. Date: Mar. 6, 1997

[30] Foreign Application Priority Data

Aug. 28, 1995 [AT] Austria ................................. 1449/95

[51] Int. Cl.[7] ........................................................ G01V 3/00
[52] U.S. Cl. .......................... 324/300; 324/303; 600/407
[58] Field of Search ................................... 324/300, 303, 324/248, 307, 301, 309, 315, 346; 600/407, 544, 409

[56] References Cited

U.S. PATENT DOCUMENTS 4,442,404  4/1984  Bergmann .
5,057,776  10/1991  Macovski .

FOREIGN PATENT DOCUMENTS

| 0 481 211 | 4/1992 | European Pat. Off. . |
| 439 756 | 4/1975 | U.S.S.R. . |
| 742 839 | 4/1978 | U.S.S.R. . |
| 2 227 095 | 7/1990 | United Kingdom . |
| WO 95/03550 | 2/1995 | WIPO . |

OTHER PUBLICATIONS

Magnetic Resonance in Medicine, vol. 30, No. 2, Aug. 1, 1993, Macovski et al "Novel Approaches to Low–Cost MRI" pp. 221–230.

Magnetic Resonance in Medicine, vol. 15, No. 3, Sep. 1, 1990, pp. 386–391; Stepisnik et al "NMR Imaging in the Earth . . . ".

Physics in Medicine and Biology, vol. 37, No. 11, Nov. 1992; pp. 2133–2138; Seton et al: "DC Squid–Based NMR . . . ".

Primary Examiner—Christine K. Oda
Assistant Examiner—Brij B. Shrivastav
Attorney, Agent, or Firm—Collard & Roe, P.C.

[57] ABSTRACT

A method and an arrangement for imaging by means of nuclear magnetic resonance. A polarizing, homogenous, static magentic field is caused to act on the body (1) to be imaged, and then this magnetic field is reduced or switched off. Subsequently, a further magnetic field directed transversely to the polarizing magnetic field is caused to act on the body (1), and the magnetic fields forming by means of nuclear magnetic resonance are sensed by means of a SQUID gradiometer (5), and the image is formed from the signals of the gradiometer.

10 Claims, 1 Drawing Sheet

NUCLEAR MAGNETIC RESONANCE IMAGING PROCESS AND DEVICE

The invention relates to a method for imaging a region of a body by sensing magnetic fields forming on account of nuclear magnetic resonance, by means of a gradiometer and processing the signals obtained with this gradiometer in a data processing device to give an image, the body being subjected to a homogenous magnetic field, and a further magnetic field in which spatial gradients of the field intensity are present being caused to act on the body.

Methods of the afore-mentioned type are known in which the body of which an image is to be made by means of nuclear magnetic resonance is constantly subjected to a homogenous static magnetic field, and in which a further magnetic field comprising spatial gradients is allowed to act on the body, and also a high frequency electromagnetic field is allowed to act on the body, the amplitude of the high frequency field in the respective body region being maintained as constant as possible, and the frequency of this field being slightly varied corresponding to the gradient of the further magnetic field according to the resonance conditions of the atoms present at the various sites of the body. With this known method, various problems occur on account of the action of the high frequency field, among which the often undesired warming on account of the high frequency field and the reduction of the field amplitude of the high frequency field in the interior of the body resulting from the skin effect are particularly to be mentioned.

It is an object of the invention to provide a different concept method of the initially defined type, in which the detrimental problems of the known methods are largely eliminated.

The inventive method of the initially defined kind is characterized in that at first the body to be examined is subjected to a homogenous polarizing static magnetic field and subsequently the field intensity of this magnetic field is reduced, preferably is brought to zero, and a further static magnetic field whose field lines extend transversely to the field lines of the said polarizing magnetic field and in which a gradient is present is caused to act on the body, and that the component of the magnetic fields thereby forming in the body on account of nuclear magnetic resonance and extending in the direction of the field lines of the polarizing magnetic field is sensed by a highly sensitive gradiometer whose detection coils do not have any signal emitting inductive coupling with the polarizing magnetic field. With this method, the afore-mentioned object can well be met. No high frequency field is required, and it is possible to work with comparatively low field intensities of the polarizing magnetic field, while nevertheless a favorable signal-noise-ratio can be obtained. The nuclear spin of the atoms of the body portion to be imaged is polarized by the polarizing magnetic field, and then this magnetic field is reduced or switched off, and the further magnetic field which is directed transversely to the polarizing magnetic field is caused to act, resulting in a precession movement of the nuclear spin in the further magnetic field, the precessing movement in turn forming a magnetic field which is sensed by the gradiometer. If the said further magnetic field is oriented perpendicularly to the polarizing magnetic field, there results from the precession movement an amplitude maximum of the magnetic field or signal detectable by means of the gradiometer in the direction of the polarizing magnetic field (z-direction). The signals emitted from the gradiometer are processed into an image by means of a data processing device.

Preferably, a SQUID gradiometer is used as the gradiometer. This results in a high sensitivity, particularly in the low frequency range of direct current up to approximately 10 kHz which is important here.

The configuration of the gradiometer which may be of the first, second, or of a higher, in particular the third, order is selected such that the detection coils of the gradiometer do not have a signal emitting inductive coupling with the polarizing magnetic field. Prferably it is provided that a gradiometer is used whose detection coils do not have any signal emitting inductive coupling with the further static magnetic field, either.

In this manner, an overload of the SQUID is reliably avoided, and the dead times are reduced, thus enabling more rapid working.

The good sensitivity of the SQUID at low frequencies can be aided by filtering out the high frequency to eliminate disturbing high frequency influences. By a respective configuration of the input coils of the magnetometer, care may be taken with a view to disturbing external fields that only the low frequency portions of the fields acting on the gradiometer are sensed.

As regards the polarization time, preferably the homogenous polarizing magnetic field is kept constant for a span of time that is approximately twice to three times that of the longitudinal relaxation time $T_1$, and subsequently is reduced, preferably switched off.

The invention also relates to an arrangement for carrying out the method according to the invention. This arrangement is characterized in that the arrangement comprises a polarization magnet forming a homogenous static magnetic field, which polarization magnet is connected to a switching means for reducing or switching off the magnetic flow, and a magnetic device suitable for forming a further static magnetic field extending transversely to the field of polarization and including spatial gradients, which further magnetic device likewise is connected to a switching means, as well as a highly sensitive gradiometer designed to sense field changes in the direction of the field of polarization, and, furthermore, a data processing device for forming an image from the gradiometer signals.

Preferably, the gradiometer is a SQUID gradiometer. For decoupling it is here advantageous if the gradiometer comprises an adjustable compensation coil next to the input coils, a compensation current determined by the current of the polarization magnet and/or by the current of the magnetic device being feedable to said adjustable compensation coil.

In the drawing, an exemplary embodiment of an arrangement for carrying out the method according to the invention is schematically illustrated.

In the drawing, the body to be examined is denoted by 1, the polarization magnet by 2, the magnetic system for forming the further magnetic field by 3, a switching device for the polarization magnet 2 and the magnet system 3 is denoted by 4, and a gradiometer by 5. The gradiometer 5 is a SQUID gradiometer having a SQUID 6 and a non-magnetic cryostat 7. A control device for the SQUID & is denoted by 8, and a data processing device for forming an image from the gradiometer signals and for controlling the magnetic fields is denoted by 9. A preferably provided adjustable compensation coil 10 is supplied with a compensation current that is dependent on the currents of the magnetic devices 2 and 3.

Arrow $B_p$ shows the direction of the polarizing magnetic field, and arrow $B_r$ indicates the direction of the above-mentioned further magnetic field.

We claim:

1. A method of imaging a region of a body by sensing magnetic fields generated by nuclear magnetic resonance in said body, which comprises the steps of (a) subjecting the body to a first homogenous static magnetic polarization field, and then reducing the field intensity of said first static magnetic polarization field, (b) causing a further static magnetic field to act on said body,
   (1) the field lines of the further static magnetic field extending transversely to the field lines of the first static magnetic polarization field, and
   (2) a gradient of the field intensity being present therein, (c) sensing from the magnetic fields generated in the body by nuclear resonance a component extending in the direction of the field lines of the first static magnetic polarization field by a highly sensitive SQUID gradiometer,
   (1) the SQUID gradiometer having detection coils that have no signal-emitting inductive coupling with the first static magnetic polarization field, and (d) processing the signals generated by the SQUID gradiometer in a data processing device to give an image.

2. A method according to claim 1, wherein the field intensity of said first polarizing static magnetic field is reduced to zero.

3. A method according to claim 1, wherein the polarizing magnetic polarization field has a field intensity in the range of from 10 mT to 100 mT is used.

4. A method according to claim 1, wherein the gradiometer is used whose detection coils do not have any signal emitting inductive coupling with the further static magnetic field, either.

5. A method according to claim 1, wherein the homogenous magnetic polarization field is kept constant for a span of time that is approximately twice to three times that of the longitudinal relaxation time $T_1$, and subsequently is reduced.

6. A method according to claim 1, characterized in that only the low frequency portions of the fields acting on the gradiometer are sensed.

7. An arrangement for imaging a region of a body by sensing magnetic fields generated by nuclear magnetic resonance in said body, which comprises (a) a polarization magnet forming a first homogeous static magnetic polarization field,
   (1) the polarization magnetic being connected to a switching means for reducing the magnetic flow of the polarization magnet, (b) a magnet device for producing a further static magnetic field extending transversely to the polarization field and which includes spatial magnetic field gradients,
   (1) the magnetic device being connected to a switching means, (c) a highly sensitive SQUID gradiometer having detection coils arranged and positioned to sense changes in the direction of the polarization field, and (d) a data processing device for forming an image of a region of said body from signals of said SQUID gradiometer.

8. An arrangement according to claim 7, wherein the SQUID gradiometer comprises an adjustable compensation coil next to input coils, a compensation current determined by the current of the polarization magnet being feedable to the detection coils.

9. An arrangement according to claim 7, wherein the SQUID gradiometer comprises an adjustable compensation coil next to input coils, a compensation current determined by the current of the magnetic device being feedable to the detection coils.

10. An arrangement according to claim 7, wherein the SQUID gradiometer comprises an adjustable compensation coil next to input coils, a compensation current determined by the current of the polarization magnet and of the magnetic device being feedable to the detection coils.

* * * * *